United States Patent
Song

(10) Patent No.: US 9,252,743 B2
(45) Date of Patent: Feb. 2, 2016

(54) DISTRIBUTED POLYPHASE FILTER

(71) Applicant: Intel Corporation, Santa Clara, CA (US)

(72) Inventor: Hongjiang Song, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 13/630,014

(22) Filed: Sep. 28, 2012

(65) Prior Publication Data

US 2014/0093009 A1 Apr. 3, 2014

(51) Int. Cl.
| | |
|---|---|
| *H04L 27/00* | (2006.01) |
| *H03H 11/22* | (2006.01) |
| *H04W 56/00* | (2009.01) |
| *H03H 7/18* | (2006.01) |
| *H03H 7/21* | (2006.01) |
| *H03H 7/01* | (2006.01) |
| *H03H 11/04* | (2006.01) |

(52) U.S. Cl.
CPC .............. *H03H 11/22* (2013.01); *H03H 7/185* (2013.01); *H03H 7/21* (2013.01); *H04W 56/0035* (2013.01); *H03H 2007/0192* (2013.01); *H03H 2011/0494* (2013.01)

(58) Field of Classification Search
CPC .. H04L 27/2652; H03D 1/2245; H03D 3/007; H03D 7/165; H03D 7/166; H03D 7/1458; H03D 7/11475; H04B 1/26; H04B 1/28; H04B 1/30; H04B 1/0082
USPC ............... 375/222, 259, 330–333, 371, 373; 327/355, 356, 359, 361; 329/302, 304, 329/306, 308, 346; 332/103
See application file for complete search history.

(56) References Cited

U.S. PATENT DOCUMENTS

| | | | | |
|---|---|---|---|---|
| 4,577,267 | A * | 3/1986 | Juutilainen | 363/19 |
| 4,696,055 | A * | 9/1987 | Marshall | 455/118 |
| 4,797,801 | A * | 1/1989 | Furuhashi et al. | 363/43 |
| 4,848,335 | A * | 7/1989 | Manes | 606/35 |
| 5,424,709 | A * | 6/1995 | Tal | 375/259 |
| 5,974,306 | A * | 10/1999 | Hornak et al. | 455/323 |
| 5,982,832 | A * | 11/1999 | Ko | 375/371 |
| 6,226,509 | B1 * | 5/2001 | Mole et al. | 455/302 |
| 6,236,847 | B1 * | 5/2001 | Stikvoort | 455/313 |
| 6,356,602 | B1 * | 3/2002 | Rodal et al. | 375/344 |
| 6,560,449 | B1 * | 5/2003 | Liu | 455/302 |
| 6,650,157 | B2 * | 11/2003 | Amick | H03L 7/0814 327/149 |
| 6,785,528 | B2 * | 8/2004 | Carpineto | 455/323 |
| 6,850,032 | B1 * | 2/2005 | Peterson | 318/801 |
| 6,900,681 | B2 * | 5/2005 | Takano | 327/175 |
| 7,155,179 | B1 * | 12/2006 | Rothenberg | 455/114.2 |

(Continued)

OTHER PUBLICATIONS

International Searching Authority, "Notification of Transmittal of the International Search Report and the Written Opinion of the International Searching Authority," mailed Oct. 24, 2013, in International application No. PCT/US2013/047220.

(Continued)

*Primary Examiner* — Emmanuel Bayard

(74) *Attorney, Agent, or Firm* — Trop, Pruner & Hu, P.C.

(57) ABSTRACT

In one embodiment, an apparatus includes a clock generator to generate differential clock signals. The apparatus also includes a distributed polyphase filter to obtain phase-corrected multi-phase clock signals based on the differential clock signals.

22 Claims, 9 Drawing Sheets

(56) References Cited

U.S. PATENT DOCUMENTS

| | | | |
|---|---|---|---|
| 7,184,740 B2* | 2/2007 | Kim | 455/324 |
| 7,202,715 B1* | 4/2007 | Fan | H03K 5/133 327/149 |
| 7,321,640 B2* | 1/2008 | Milne et al. | 375/330 |
| 7,388,416 B2* | 6/2008 | Marutani | 327/201 |
| 7,499,297 B2* | 3/2009 | Stulz et al. | 363/37 |
| 7,545,857 B2* | 6/2009 | Liu | 375/222 |
| 7,590,185 B2* | 9/2009 | Koga et al. | 375/260 |
| 7,630,566 B2* | 12/2009 | MacInnis et al. | 382/238 |
| 7,689,189 B2* | 3/2010 | De Ruijter | 455/213 |
| 7,733,144 B2* | 6/2010 | Guo | H03K 3/356139 327/202 |
| 7,742,545 B2* | 6/2010 | Salvi et al. | 375/322 |
| 7,746,764 B2* | 6/2010 | Rawlins et al. | 370/208 |
| 7,782,128 B2* | 8/2010 | Wang | 329/304 |
| 7,984,093 B1* | 7/2011 | Tu et al. | 708/819 |
| 8,004,335 B2* | 8/2011 | Kim | H03B 27/00 327/231 |
| 8,116,690 B2* | 2/2012 | Rofougaran et al. | 455/66.1 |
| 8,324,949 B2* | 12/2012 | Cherkassky et al. | 327/175 |
| 8,526,901 B2* | 9/2013 | Kodama | H03H 7/0153 455/266 |
| 8,532,236 B2* | 9/2013 | Kerth | 375/346 |
| 8,743,568 B2* | 6/2014 | Maeda | H02M 7/48 363/37 |
| 8,754,678 B1* | 6/2014 | Schell | H03B 28/00 327/106 |
| 8,760,209 B2* | 6/2014 | Schell | H03H 7/06 327/237 |
| 8,797,111 B2* | 8/2014 | Oishi | 332/103 |
| 9,018,996 B1* | 4/2015 | Zarei | H04B 1/7176 327/115 |
| 2003/0001648 A1* | 1/2003 | Okazaki et al. | 327/252 |
| 2003/0117200 A1* | 6/2003 | Koh et al. | 327/238 |
| 2003/0117201 A1* | 6/2003 | Wang | 327/254 |
| 2004/0002323 A1* | 1/2004 | Zheng | 455/324 |
| 2004/0116096 A1* | 6/2004 | Shen | 455/323 |
| 2004/0137869 A1* | 7/2004 | Kim | 455/324 |
| 2006/0152269 A1 | 7/2006 | Marutani | |
| 2006/0178125 A1* | 8/2006 | Chae et al. | 455/323 |
| 2006/0229011 A1* | 10/2006 | Naitou | 455/39 |
| 2006/0246861 A1* | 11/2006 | Dosanjh et al. | 455/147 |
| 2008/0032639 A1* | 2/2008 | Kee et al. | 455/110 |
| 2008/0106343 A1* | 5/2008 | Jang et al. | 331/45 |
| 2008/0107212 A1* | 5/2008 | Baumgartner et al. | 375/340 |
| 2008/0132189 A1* | 6/2008 | Maxim et al. | 455/280 |
| 2008/0132195 A1* | 6/2008 | Maxim et al. | 455/334 |
| 2008/0144760 A1* | 6/2008 | Song et al. | 375/371 |
| 2009/0058538 A1* | 3/2009 | Kantor et al. | 331/45 |
| 2009/0201064 A1* | 8/2009 | Kim et al. | 327/299 |
| 2009/0315611 A1* | 12/2009 | Lu | 327/361 |
| 2010/0261446 A1* | 10/2010 | McMullin et al. | 455/226.1 |
| 2010/0302100 A1* | 12/2010 | Yang et al. | 342/357.73 |
| 2011/0043296 A1* | 2/2011 | Moh | 332/170 |
| 2011/0057723 A1* | 3/2011 | Miyake et al. | 327/552 |
| 2011/0068843 A1* | 3/2011 | Kodama | 327/238 |
| 2011/0092169 A1* | 4/2011 | Savoj | 455/73 |
| 2011/0236027 A1* | 9/2011 | Nosaka et al. | 398/135 |
| 2012/0007638 A1 | 1/2012 | Meng et al. | |
| 2012/0049920 A1* | 3/2012 | Kurachi | 327/254 |
| 2012/0086489 A1 | 4/2012 | Cherkassky et al. | |
| 2012/0200233 A1* | 8/2012 | Pauritsch et al. | 315/279 |
| 2013/0027272 A1* | 1/2013 | Karthaus | 343/850 |
| 2013/0267188 A1* | 10/2013 | Allott et al. | 455/326 |
| 2014/0029653 A1* | 1/2014 | Soltanian et al. | 375/221 |
| 2014/0091848 A1* | 4/2014 | Morishita et al. | 327/355 |

OTHER PUBLICATIONS

International Preliminary Examination Report on Patentability issued in corresponding PCT/US2013/047220 dated Jun. 18, 2015, (8 pages).

* cited by examiner

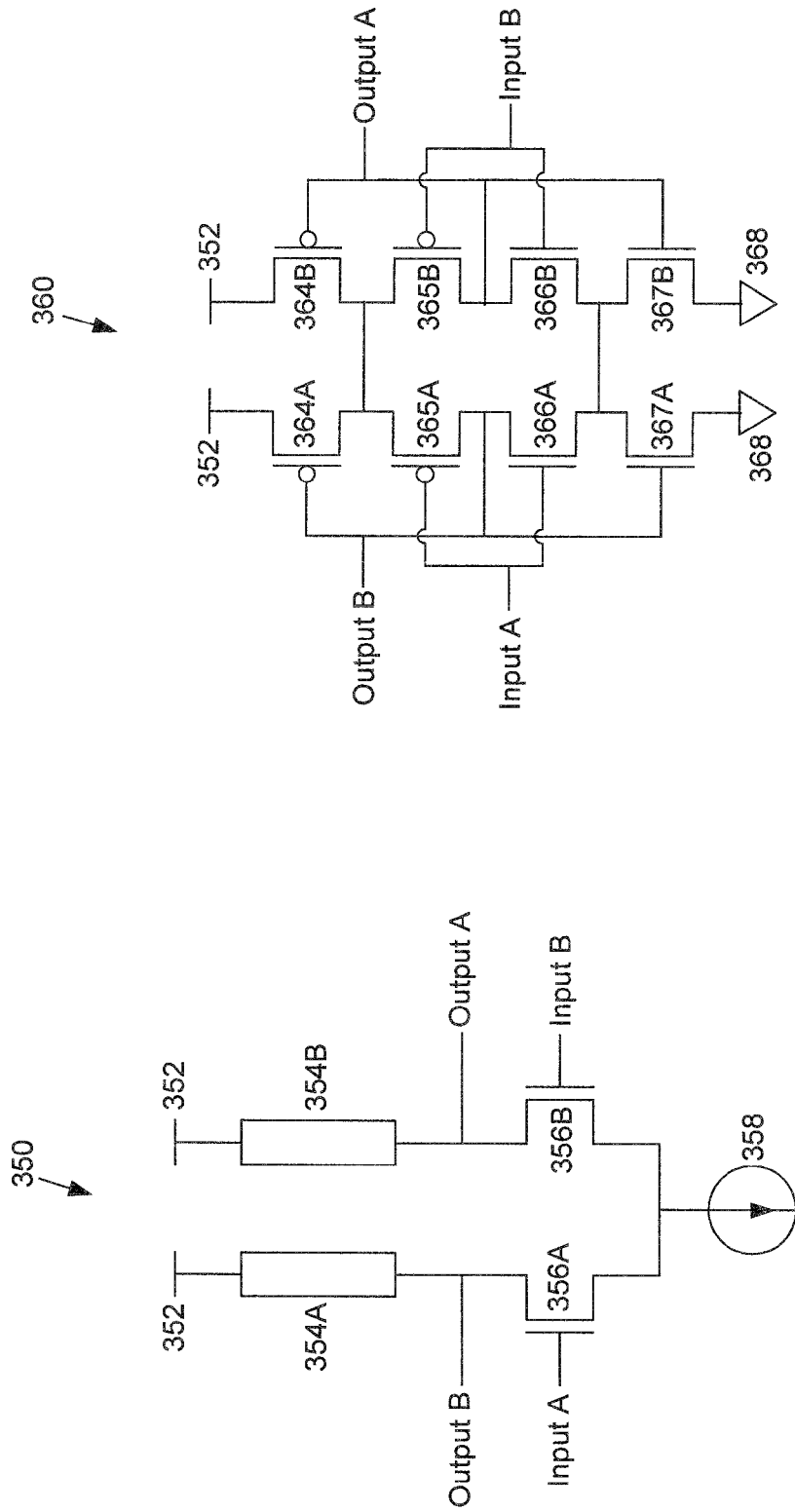

DISTRIBUTED POLYPHASE FILTER

BACKGROUND

Embodiments relate generally to data interfaces for electronic devices.

Many electronic devices include multiple components coupled together by one or more data interfaces. For example, a cellular telephone may include a processor core coupled to a radio transceiver, a sound input device, a sound output device, a camera, a display device, a memory device, etc. The functionality of such components has been continually improved to meet market demands. Accordingly, the data interfaces between the components may need to be adapted to such functionality.

BRIEF DESCRIPTION OF THE DRAWINGS

FIGS. 3A-3C are block diagrams of systems in accordance with one or more embodiments.

DETAILED DESCRIPTION

In accordance with some embodiments, a distributed polyphase filter may enable efficient phase-correction of multi-phase clock signals. The distributed polyphase filter may reduce the electrical power and circuitry area required to generate the corrected multi-phase clock signals. Further, in some embodiments, the distributed polyphase filter may eliminate or reduce non-idealities in the multi-phase clock signals, such as static phase error, duty cycle error, and/or jitter, which may result in degraded I/O bit-error-rate.

Figure 1:
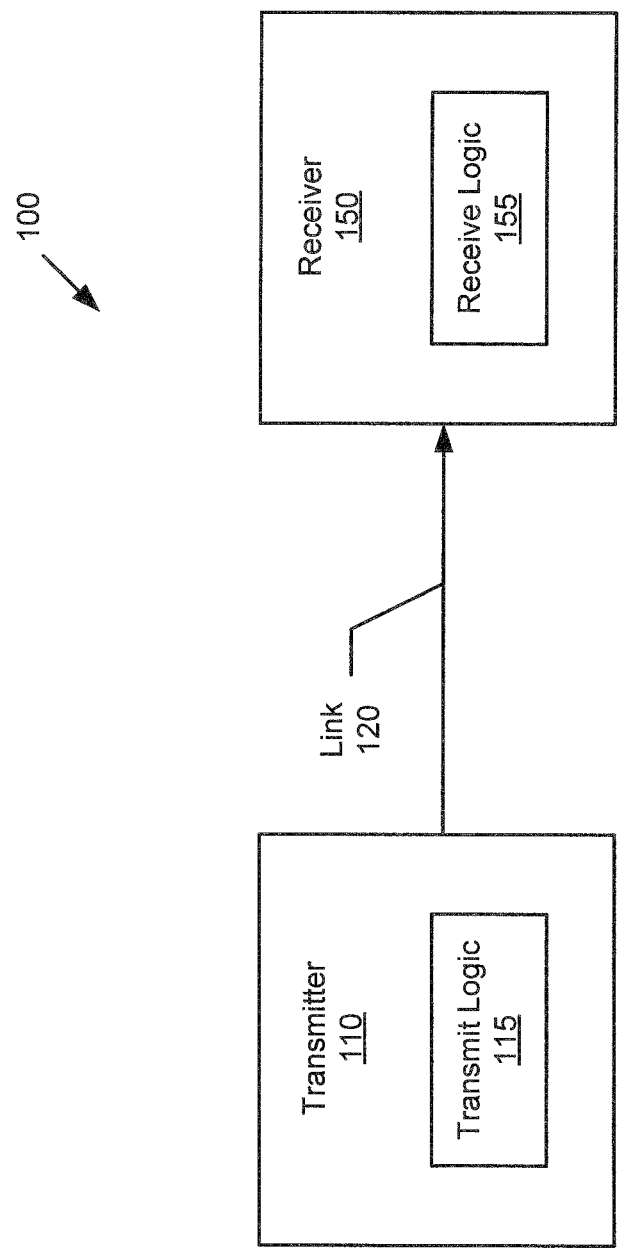
FIG. 1 is a block diagram of a system in accordance with one or more embodiments.

Referring to FIG. 1, shown is a block diagram of an apparatus 100 in accordance with one or more embodiments. As shown in FIG. 1, the apparatus 100 may include a link 120 connecting a transmitter 110 and a receiver 150. In accordance with some embodiments, the apparatus 100 may be any electronic device, such as a cellular telephone, a computer, a media player, a network device, etc.

In some embodiments, the transmitter 110 and the receiver 150 may exist to connect any components or peripherals of the apparatus 100, such as a processor, a processor core, a memory device, a display device, a sound device, a wireless transceiver, a camera, etc. Note that, while only one pair of transmitter 110 and receiver 150 is shown for the sake of clarity, the example shown in FIG. 1 is not intended to be limiting. Accordingly, it should be appreciated that any number of such transmitter-receiver pairs may exist to connect various components of the apparatus 100.

In accordance with some embodiments, the link 120 may be any number of electrical and/or data connections (e.g., motherboard connection, input/output cable, network connector, bus, wireless link, etc.). In one or more embodiments, the transmitter 110 may include transmit logic 115 to manage data connections to the receiver 150. Further, in some embodiments, the receiver 150 may include receive logic 155 to manage the data connections from the transmitter 110.

In accordance with some embodiments, the link 120, the transmit logic 115, and the receive logic 155 may use one or more data interface protocols. For example, in some embodiments, the link 120, the transmitter 110, and the receiver 150 use the M-PHY specification of the Mobile Industry Processor Interface (MIPI) Alliance (MIPI Specification for M-PHY Version 1.00.00 of Feb. 8, 2011, approved Apr. 28, 2011). In such embodiments, the link 120 include serial lines carrying differential pulse width modulated (PWM) signals. Optionally, such differential signals may be referred to as "self-clocking" if clock information is included in the period of the differential signal waveform.

In one or more embodiments, the link 120 includes differential PWM signals operating under one or more data rate ranges of the M-PHY specification (referred to as "gears"). For example, the link 120 may operate under gear 1 (3 Mbps to 9 Mbps), gear 2 (6 Mbps to 18 Mbps), gear 3 (12 Mbps to 36 Mbps), gear 4 (24 Mbps to 72 Mbps), gear 5 (48 Mbps to 144 Mbps), gear 6 (96 Mbps to 288 Mbps), gear 7 (192 Mbps to 576 Mbps), etc.

In one or more embodiments, the transmit logic 115 uses a multi-phase clock signal to transmit one or more data signals using the link 120. For example, in some embodiments, the transmit logic 115 may use four-phase reference clock signals to generate a set of differential pulse width modulated (PWM) data signals (i.e., positive and negative waveforms) for an in-phase (I) component, and a set of differential PWM data signals for a quadrature (Q) component. In some embodiments, such differential PWM data signals may include self-clocking information. Further, in one or more embodiments, the receive logic 155 may use a multi-phase reference clock signal to recover data from differential PWM signals received from the link 120.

In one or more embodiments, the transmit logic 115 and/or the receive logic 155 may be implemented in hardware, software, and/or firmware. In firmware and software embodiments, they may be implemented by computer executed instructions stored in a non-transitory computer readable medium, such as an optical, semiconductor, or magnetic storage device. While shown with this particular implementation in the embodiment of FIG. 1, the scope of the various embodiments discussed herein is not limited in this regard.

Figure 2:
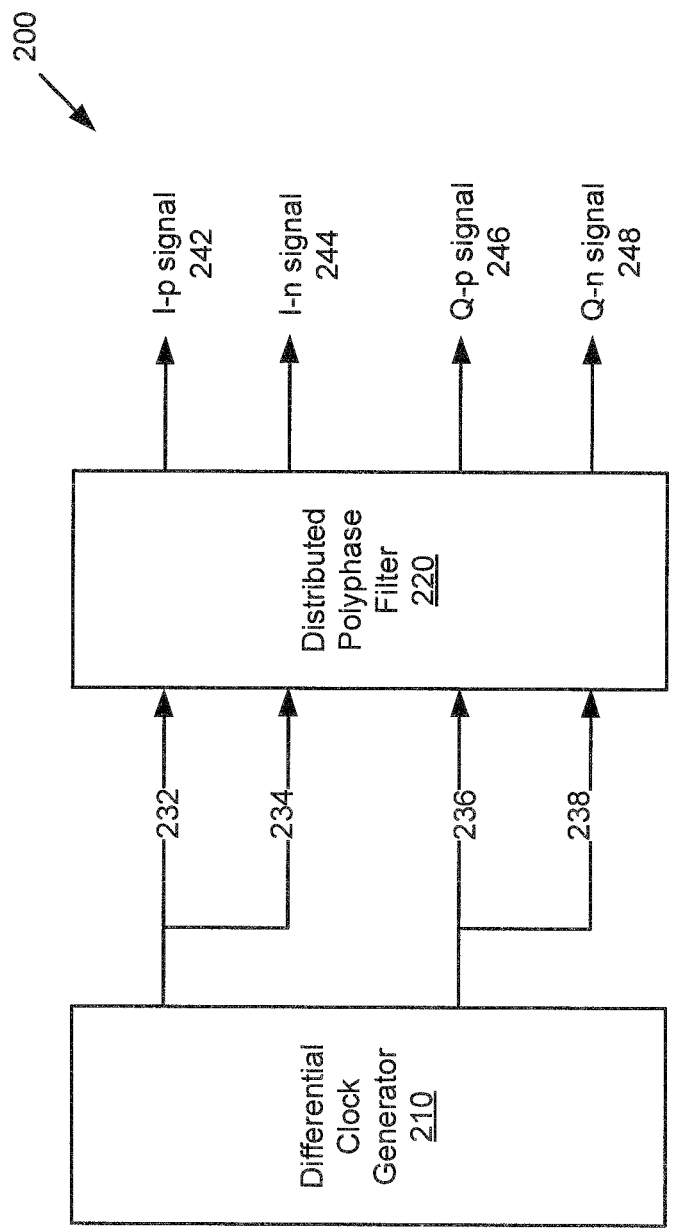
FIG. 2 is a block diagram of a system in accordance with one or more embodiments.

Referring to FIG. 2, shown is a block diagram of a clock logic 200 in accordance with one or more embodiments. More specifically, the clock logic 200 may generally correspond to all or a portion of the transmit logic 115 and/or receive logic 155 shown in FIG. 1. In some embodiments, the clock logic 200 may include a clock generator 210 and a distributed polyphase filter 220.

As shown, in one or more embodiments, the clock generator 210 may generate a first pair of differential clock signals, namely a first positive signal 232 and a first negative signal 234, corresponding to a clock signal for an in-phase component. Further, the clock generator 210 may also generate a second pair of differential clock signals, namely a second positive signal 236 and a second negative signal 238, corresponding to a clock signal for a quadrature component.

In one or more embodiments, each differential clock signal generated by the clock generator 210 may be offset by a predefined phase separation (e.g., 30 degrees, 60 degrees, 90 degrees, etc.). For example, in some embodiments, the first positive signal 232, the second positive signal 236, the first negative signal 234, and the second negative signal 238 may be offset from each other by 90 degrees, and may thus correspond to clock phases of 0 degrees, 90 degrees, 180 degrees and 270 degrees, respectively.

In one or more embodiments, the clock generator 210 generates clock signals based on a received gear selection input. In some embodiments, the gear selection input may be any identifier or indication to identify any one of a number of gears (i.e., data rate ranges). For example, in some embodiments, the gear selection input is one of the seven gears as defined by the MIPI Specification for M-PHY, Version 1.00.00. Further, in accordance with some embodiments, the clock generator 210 includes a delay locked loop (DLL), a phase locked loop (PLL), and/or any similar components.

In one or more embodiments, the distributed polyphase filter 220 receives the multi-phase clock signals generated by the clock generator 210. Further, in some embodiments, the distributed polyphase filter 220 includes functionality to reduce phase distortion in the received clock signals, and thus obtain phase-corrected multi-phase clock signals. As shown, in one or more embodiments, the phase-corrected clock signals output by the distributed polyphase filter 220 includes a corrected in-phase positive ("I-p") clock signal 242 and a corrected in-phase negative ("I-n") clock signal 244, corresponding to a phase-corrected clock signal for an in-phase component.

Further, in one or more embodiments, the phase-corrected clock signals output by the distributed polyphase filter 220 also include a corrected quadrature positive ("Q-p") clock signal 246 and a corrected quadrature negative ("Q-n") clock signal 248, corresponding to a phase-corrected clock signal for a quadrature component. In one or more embodiments, the phase-corrected multi-phase clock signals are distributed to various components using a clock signal distribution network (not shown).

Figure 3A:
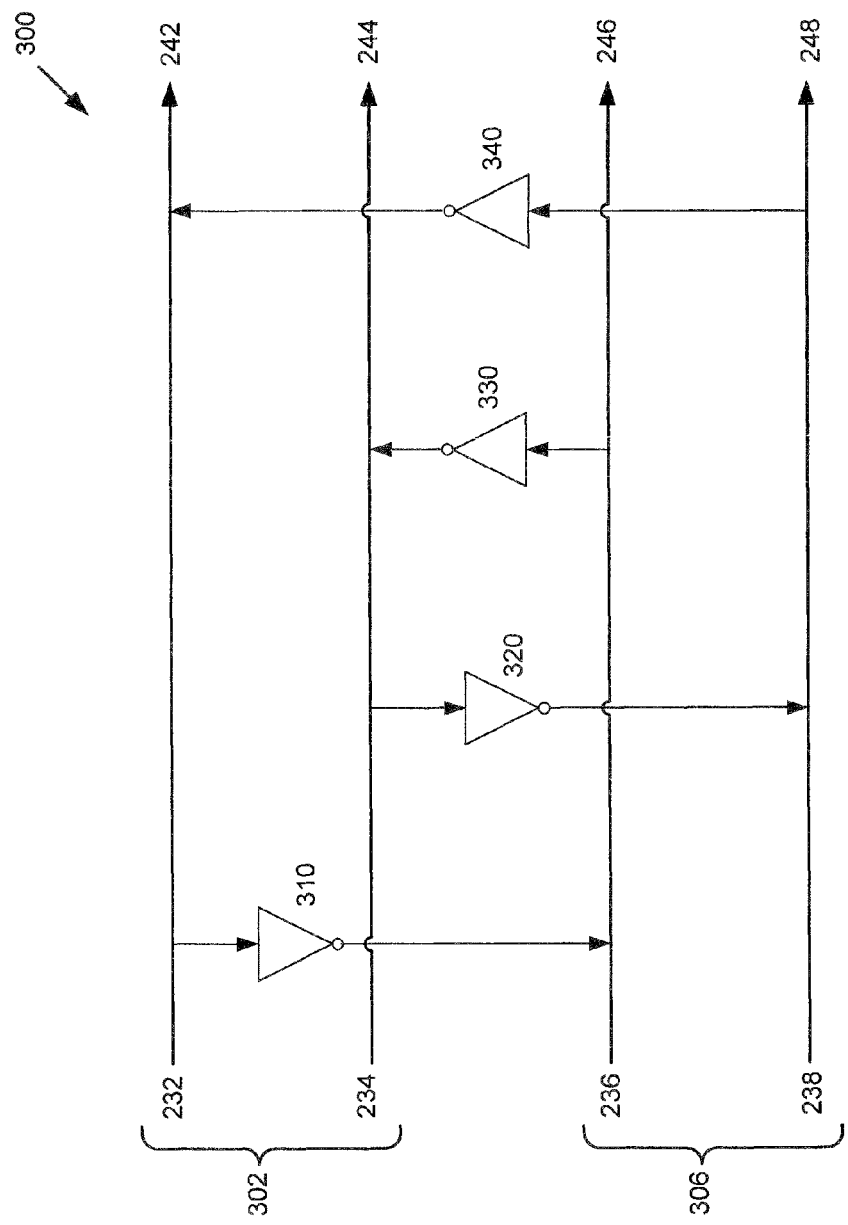

Referring now to FIG. 3A, shown is a block diagram of a distributed polyphase filter 300 in accordance with one or more embodiments. More specifically, in some embodiments, the distributed polyphase filter 300 may generally correspond to all or part of the distributed polyphase filter 220 shown in FIG. 2.

In one or more embodiments, the distributed polyphase filter 300 receives a first pair 302 of differential clock signals (i.e., first positive signal 232 and first negative signal 234) and a second pair of differential clock signals 306 (i.e., second positive signal 236 and second negative signal 238) as input signals. In some embodiments, these input signals are received from a clock generator (e.g., differential clock generator 210 shown in FIG. 2). Further, the distributed polyphase filter 300 may output phase-corrected differential clock signals 242, 244 corresponding to an in-phase component, and phase-corrected differential clock signals 246, 248 corresponding to a quadrature component.

As shown, in one or more embodiments, the distributed polyphase filter 300 includes a first inverter 310, a second inverter 320, a third inverter 330, and a fourth inverter 340. In some embodiments, the input of the first inverter 310 is coupled to the first positive signal 232, and the output of the first inverter 310 is coupled to the second positive signal 236. Further, in some embodiments, the input of the second inverter 320 is coupled to the first negative signal 234, and the output of the second inverter 320 is coupled to the second negative signal 238.

In one or more embodiments, the input of the third inverter 330 is coupled to the second positive signal 236, and the output of the third inverter 330 is coupled to the first negative signal 234. Further, in some embodiments, the input of the fourth inverter 340 is coupled to the second negative signal 238, and the output of the fourth inverter 340 is coupled to the first positive signal 232.

In accordance with some embodiments, the differential clock signals 242-248 may require a phase separation of 90 degrees. Further, in some embodiments, the differential clock signals in each pair 302, 306 may be separated by a phase separation of 180 degrees. For example, in one or more embodiments, the differential clock signal 242 corresponds to a clock phase of 0 degrees, and the differential clock signal 244 corresponds to a clock phase of 180 degrees. In addition, in this example, the differential clock signal 246 corresponds to a clock phase of 90 degrees, and the differential clock signal 248 corresponds to a clock phase of 270 degrees.

In one or more embodiments, the inverters 310-340 may enable a phase separation of 90 degrees for the differential clock signals 242-248. For example, in some embodiments, the first inverter 310 may enable the 0 degree signal (i.e., clock signal 242) to drive the 90 degree signal (i.e., clock signal 246). Further, the third inverter 330 may enable the 90 degree signal (i.e., clock signal 246) to drive the 180 degree signal (i.e., clock signal 244). Furthermore, the second inverter 320 may enable the 180 degree signal (i.e., clock signal 244) to drive the 270 degree signal (i.e., clock signal 248). Finally, the fourth inverter 340 may enable the 270 degree signal (i.e., clock signal 248) to drive the 0 degree signal (i.e., clock signal 242). In this manner, the driving pattern provided by the inverters 310-340 may form a rotational symmetry (i.e., 0 to 90 to 180 to 270 to 0) for the distributed polyphase filter 300.

Optionally, in some embodiments, the inverters 310-340 may be located in a particular sequential order. For example, in some embodiments, the second inverter 320 is located after the first inverter 310, meaning that the connection points of the second inverter 320 are located at a point along the differential clock signals 302, 306 that is closer to the distributed polyphase filter 300 that the connection points of the first inverter 310. Further, in some embodiments, the third inverter 330 is located after the second inverter 320. Furthermore, in some embodiments, the fourth inverter 340 may be located after the third inverter 330.

In some embodiments, the inverters 310-340 of the distributed polyphase filter 300 may be replaced with other components. In particular, in one or more embodiments, the distributed polyphase filter 300 may instead use the differential buffers described below with reference to FIG. 3B and FIG. 3C.

Referring now to FIG. 3B, shown is a block diagram of a current mode logic (CML) differential buffer 350 in accordance with one or more embodiments. As shown, in some embodiments, the CML differential buffer 350 includes transistors 356A, 356B, current source 358, resistors 354A, 354B, and voltage source 352. In some embodiments, these components may be coupled together as illustrated in FIG. 3B. In one or more embodiments, the CML differential buffer 350 is symmetric in a left-to-right direction.

In one or more embodiments, as shown, the gate of transistor 356A is coupled to a first input signal ("Input A"), and the gate of transistor 356B is coupled to a second input signal ("Input B"). Further, a first terminal of each of the transistors 356A, 356B is coupled to the current source 358. In addition, a second terminal of each of the transistors 356A, 356B is coupled to the resistors 354A, 354B. Furthermore, the resistors 354A, 354B is coupled to the voltage source 352 (e.g., $V_{cc}$). As shown, the node between transistor 356B and resistor 354B provides a first output signal ("Output A").

Further, the node between transistor 356A and resistor 354A provides a second output signal ("Output B").

In some embodiments, the inverters 310-340 of the distributed polyphase filter 300 may be replaced by two instances of the CML differential buffer 350. More specifically, in some embodiments, a first instance of CML differential buffer 350 may replace the first inverter 310 and the second inverter 320. Thus, in the case of the first instance of the buffer 360, Input A may be coupled to the first positive signal 232, and Output A may be coupled to the second positive signal 236. In addition, Input B may be coupled to the first negative signal 234, and Output B may be coupled to the second negative signal 238.

Further, in such embodiments, a second instance of CML differential buffer 350 may replace the third inverter 330 and the fourth inverter 340. Thus, in the case of the second instance of the buffer 360, Input A may be coupled to the second positive signal 236, and the Output A may be coupled to the first negative signal 234. Further, in such embodiments, Input B may be coupled to the second negative signal 238, and Output B may be coupled to the first positive signal 232.

Referring now to FIG. 3C, shown is a block diagram of a pseudo-differential differential buffer 360 in accordance with one or more embodiments. As shown, in some embodiments, the pseudo-differential differential buffer 360 includes two input transistors 365A, 366A to receive a first input signal ("Input A"), and two input transistors 365B, 366B to receive a second input signal ("Input B"). Further, in some embodiments, the pseudo-differential differential buffer 360 also includes two output transistors 364B, 367B to provide a first output signal ("Output A"), and two output transistors 364A, 367A to receive a second output signal ("Output B").

In some embodiments, transistors 364A-367B may be coupled together as illustrated in FIG. 3C. Further, in some embodiments, transistors 364A, 364B may be coupled to a supply voltage 352 (e.g., V.sub.cc). Furthermore, in some embodiments, transistors 367A, 367B may be coupled to ground 368 (e.g., V.sub.ss). In some embodiments, the pseudo-differential differential buffer 360 is symmetric in both left-to-right and top-to-bottom directions.

In some embodiments, the inverters 310-340 of the distributed polyphase filter 300 may be replaced by two instances of the pseudo-differential differential buffer 360. More specifically, in some embodiments, a first instance of pseudo-differential differential buffer 360 may replace the first inverter 310 and the second inverter 320. Thus, in the case of the first instance of the buffer 360, Input A may be coupled to the first positive signal 232, and Output A may be coupled to the second positive signal 236. In addition, Input B may be coupled to the first negative signal 234, and Output B may be coupled to the second negative signal 238.

Further, in such embodiments, a second instance of pseudo-differential differential buffer 360 may replace the third inverter 330 and the fourth inverter 340. Thus, in the case of the second instance of the buffer 360, Input A may be coupled to the second positive signal 236, and the Output A may be coupled to the first negative signal 234. Further, in such embodiments, Input B may be coupled to the second negative signal 238, and Output B may be coupled to the first positive signal 232.

Note that the examples shown in FIGS. 1, 2, and 3A-3C are provided for the sake of illustration, and are not intended to limit any embodiments. For example, referring to FIG. 1, embodiments may include any number and/or arrangement of transmitters 110 and/or receivers 150. In another example, referring to FIG. 2, the clock logic 200 may include additional components such as input buffers, output buffers, etc. In yet another example, referring to FIG. 3, the distributed polyphase filter 300 may include additional and/or different components to correct clock signals. It is contemplated that some embodiments may include any number of components in addition to those shown, and that different arrangement of the components shown may occur in certain implementations. Further, it is contemplated that specifics in the examples shown in FIGS. 1, 2, and 3 may be used anywhere in one or more embodiments.

Figure 4:
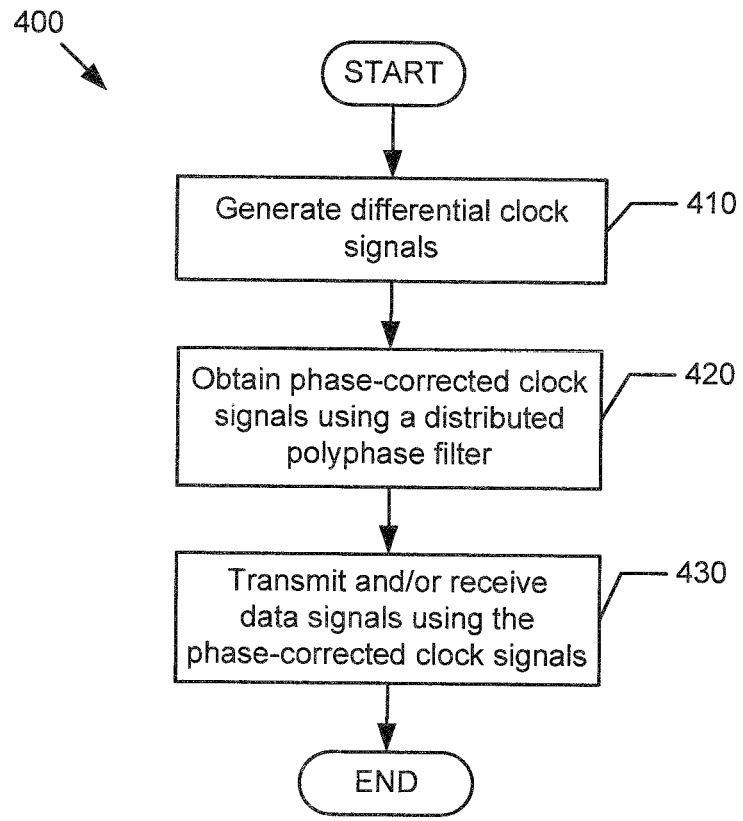
FIG. 4 is a flow chart of a method in accordance with one or more embodiments.

FIG. 4 shows a sequence 400 for generating phase corrected clock signals in accordance with one or more embodiments. In one embodiment, the sequence 400 may be part of the transmit logic 115 and/or the receive logic 155 shown in FIG. 1. In other embodiments, the sequence 400 may be implemented by any other part of transmitter 110 and/or receiver 150. The sequence 400 may be implemented in hardware, software, and/or firmware. In firmware and software embodiments it may be implemented by computer executed instructions stored in a non-transitory computer readable medium, such as an optical, semiconductor, or magnetic storage device.

At step 410, differential clock signals is generated. For example, referring to FIG. 2, the clock generator 210 may generate a first pair of differential clock signals 232, 234, corresponding to a clock signal for an in-phase component. The clock generator 210 may also generate a second pair of differential clock signals 236, 238, corresponding to a clock signal for a quadrature component. In one or more embodiments, the generated differential clock signals may be separated by a predefined phase separation (e.g., 90 degrees). Further, in some embodiments, the differential clock signals may be generated based on a received gear selection input (i.e., a predefined data rate range).

At step 420, the differential clock signals (generated at step 410) is processed by a distributed polyphase filter to obtain phase-corrected differential clock signals. For example, referring to FIG. 3, the distributed polyphase filter 300 may receive a first pair 302 and a second pair of differential clock signals 306 as inputs. In response, the distributed polyphase filter 300 may output phase-corrected differential clock signals 242, 244 corresponding to an in-phase component, and phase-corrected differential clock signals 246, 248 corresponding to a quadrature component.

At step 430, data signals are transmitted and/or received using the phase-corrected differential clock signals (obtained at step 420). For example, referring to FIG. 1, the transmitter 110 may use the phase-corrected differential clock signals to generate and transmit data signals. Further, the receiver 150 may use the phase-corrected differential clock signals to recover data from received data signals. In one or more embodiments, the phase-corrected differential clock signals may be distributed to various components of the transmitter 110 and/or the receiver 150 using a clock signal distribution network. After step 430, the sequence 400 ends.

Figure 5:
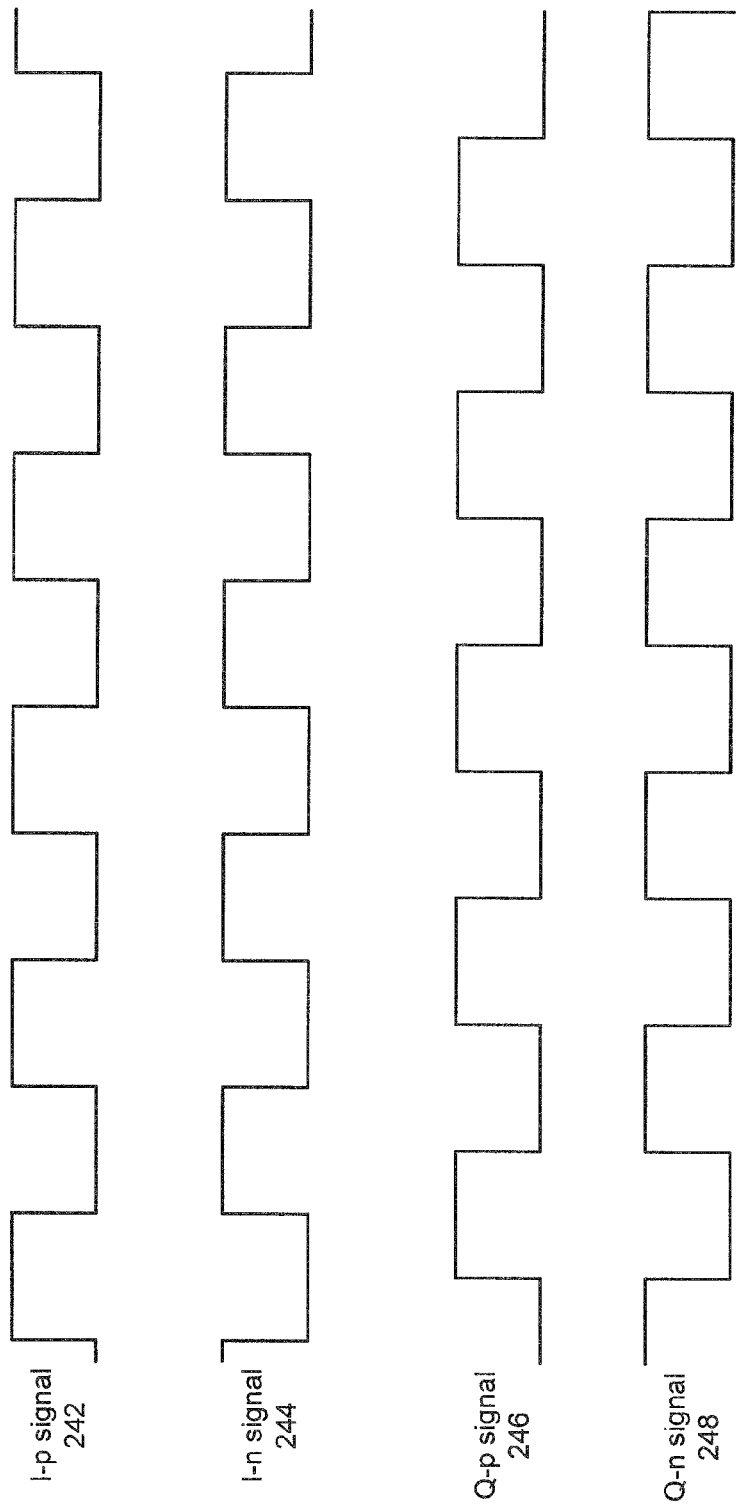
FIG. 5 is an example timing diagram in accordance with one or more embodiments.

Referring now to FIG. 5, shown is an example timing diagram of a system in accordance with some embodiments. In particular, FIG. 5 illustrates an example timing diagram for the phase-corrected multi-phase clock signals 242-248 shown in FIG. 2. As discussed above with reference to FIG. 2, the distributed polyphase filter 220 includes functionality to phase-correct clock signals by reducing phase distortion in received clock signals. For example, the distributed polyphase filter 220 eliminates or reduces non-idealities in the multi-phase clock signals, such as static phase error, duty cycle error, and/or jitter. Accordingly, assume that the multi-phase clock signals 242-248 have been phase-corrected using the distributed polyphase filter 220 to have a desired phase separation (e.g., 90 degrees).

As shown in FIG. 5, the top two signals are a corrected in-phase positive ("I-p") clock signal 242 and a corrected in-phase negative ("I-n") clock signal 244. In one or more embodiments, I-p signal 242 and I-n signal 244 may be phase-corrected differential clock signals for an in-phase component. Note that, because I-p signal 242 and I-n signal 244 are differential signals, their respective phases are separated by 180 degrees.

The bottom two signals shown in FIG. 5 are a corrected quadrature positive ("Q-p") clock signal 246 and a corrected quadrature negative ("Q-n") clock signal 248. In one or more embodiments, Q-p signal 246 and Q-n signal 248 may be phase-corrected differential clock signals for a quadrature component. Note that Q-p signal 246 and Q-n signal 248 are differential signals, and thus their respective phases are separated by 180 degrees. Note also that each of the in-phase signals 242, 244 are separated from each of the quadrature signals 246, 248 by a phase separation of 90 degrees.

Figure 6:
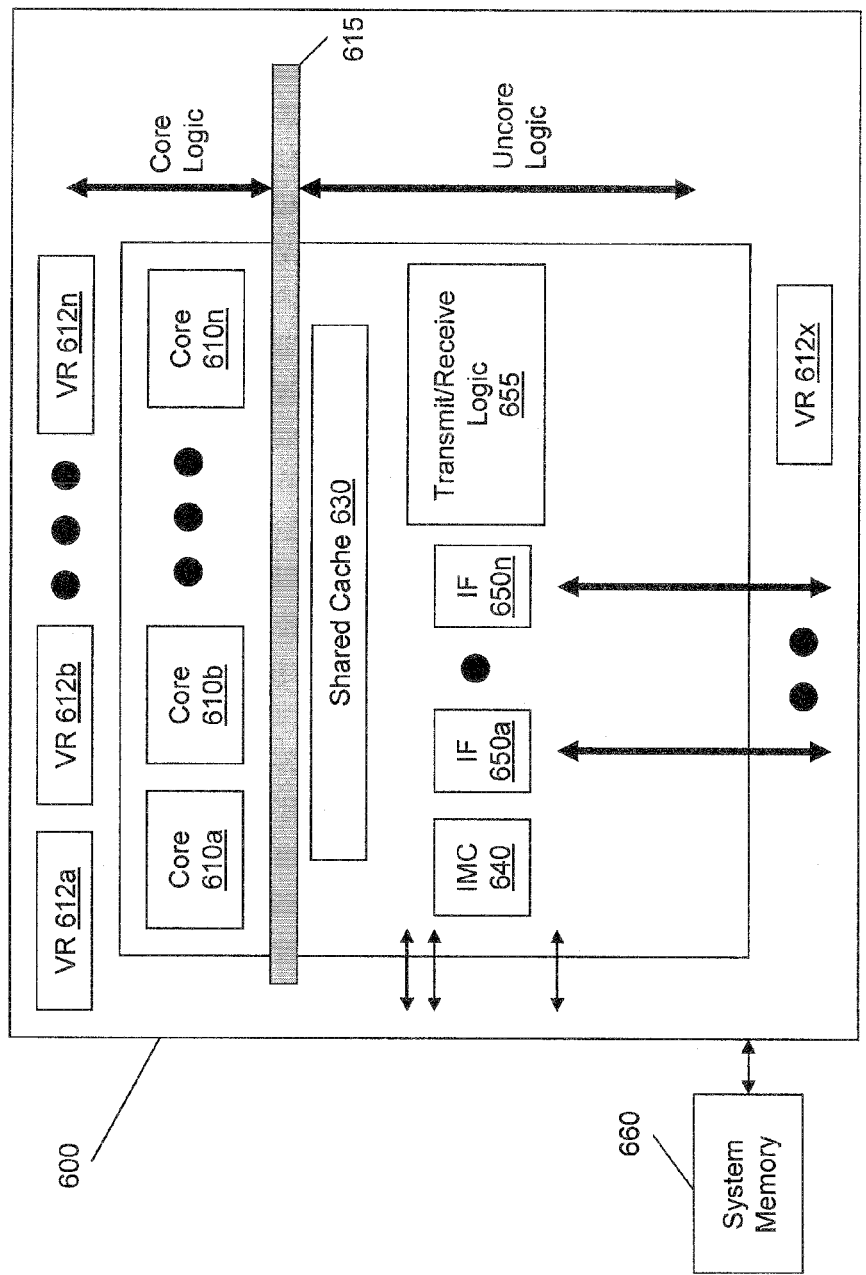
FIG. 6 is a block diagram of a processor in accordance with one or more embodiments.

Referring now to FIG. 6, shown is a block diagram of a processor in accordance with one or more embodiments. As shown in FIG. 6, processor 600 may be a multicore processor including a plurality of cores 610a-610n. Each core may be associated with a corresponding voltage regulator 612a-612n. The various cores may be coupled via an interconnect 615 to an uncore logic that includes various components. As seen, the uncore logic may include a shared cache 630 which may be a last level cache. In addition, the uncore logic may include an integrated memory controller 640, various interfaces 650 and transmit/receive logic 655.

In one or more embodiments, transmit/receive logic 655 may include all or a portion of the clock logic 200 and/or the distributed polyphase filter 300 described above with reference to FIGS. 2-3. Thus, the transmit/receive logic 655 may enable the cores 610a-610n and/or other components (e.g., components included in a mobile computing device) to generate phase-corrected multi-phase clock signals in accordance with some embodiments.

With further reference to FIG. 6, processor 600 may communicate with a system memory 660, e.g., via a memory bus. In addition, by interfaces 650, connection can be made to various off-chip components such as peripheral devices, mass storage and so forth. While shown with this particular implementation in the embodiment of FIG. 6, the scope of the various embodiments discussed herein is not limited in this regard.

Figure 7:
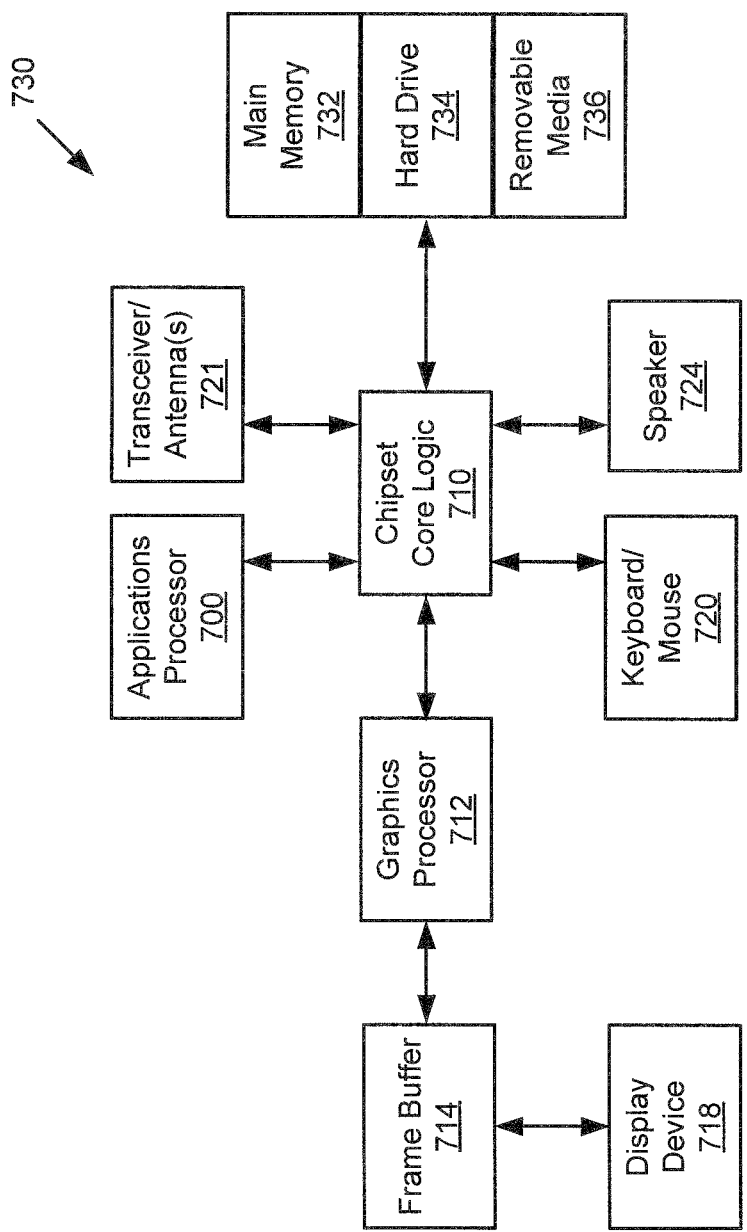
FIG. 7 is a block diagram of an example system in accordance with one or more embodiments.

Embodiments may be used in many different environments. Referring now to FIG. 7, shown is a block diagram of a computer system 730 with which embodiments can be used. The computer system 730 may include a hard drive 734 and a removable storage medium 736, coupled by a bus (shown as an arrow) to a chipset core logic 710. A keyboard and/or mouse 720, or other conventional components, may be coupled to the chipset core logic.

The core logic may couple to the graphics processor 712, and the applications processor 700 in one embodiment. The graphics processor 712 may also be coupled to a frame buffer 714. The frame buffer 714 may be coupled to a display device 718, such as a liquid crystal display (LCD) touch screen. In one embodiment, the graphics processor 712 may be a multithreaded, multi-core parallel processor using single instruction multiple data (SIMD) architecture.

The chipset logic 710 may include a non-volatile memory port to couple to the main memory 732. Also coupled to the core logic 710 may be a radio transceiver and antenna(s) 721.

Speakers 724 may also be coupled to core logic 710. In one or more embodiments, core logic 710 may include all or a portion of the clock logic 200 and/or the distributed polyphase filter 300 described above with reference to FIGS. 2-3.

Figure 8:
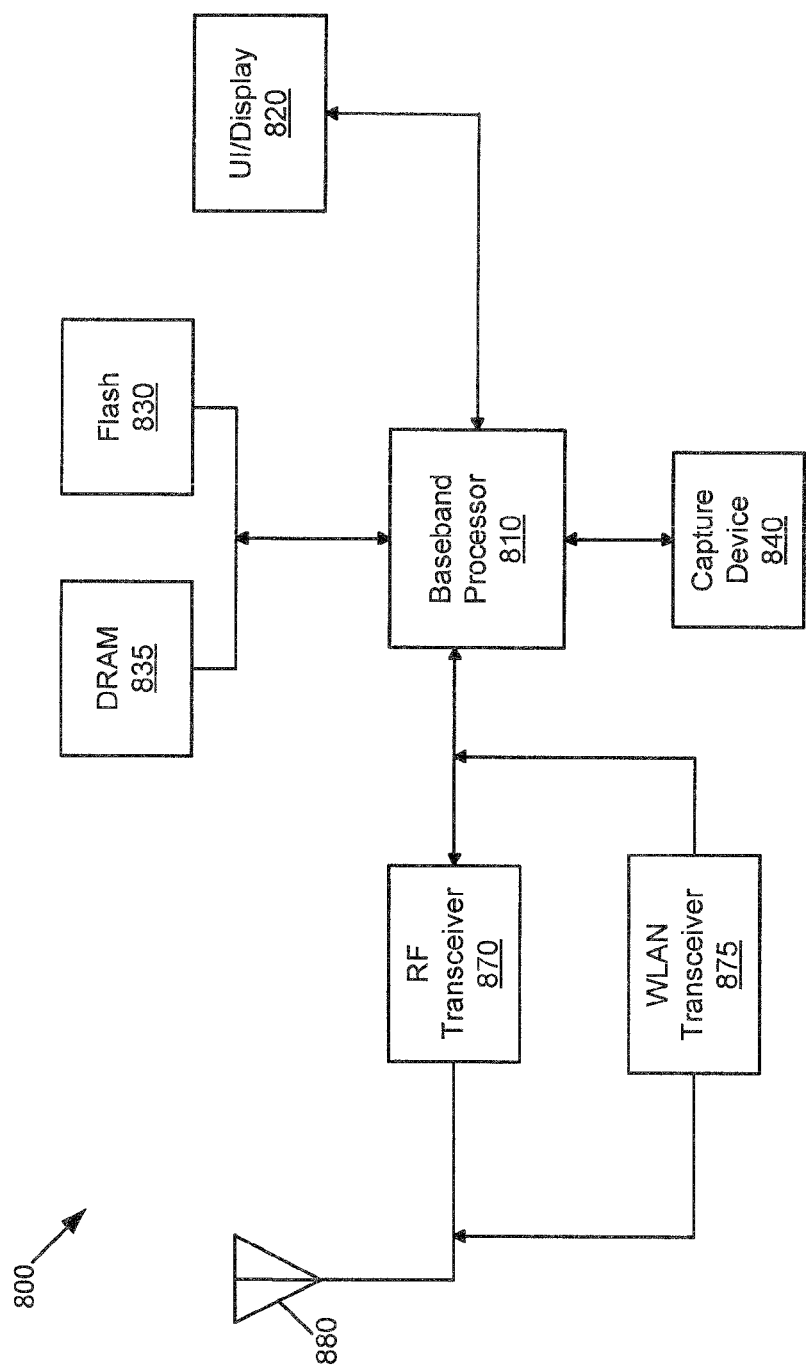
FIG. 8 is a block diagram of an example system in accordance with one or more embodiments.

Referring now to FIG. 8, shown is a block diagram of an example system 800 with which embodiments can be used. As seen, system 800 may be a smartphone or other wireless communicator. As shown in the block diagram of FIG. 8, system 800 may include a baseband processor 810 which may be a multicore processor that can handle both baseband processing tasks as well as application processing. Thus baseband processor 810 can perform various signal processing with regard to communications, as well as perform computing operations for the device. In turn, baseband processor 810 can couple to a user interface/display 820 which can be realized, in some embodiments by a touch screen display.

In addition, baseband processor 810 may couple to a memory system including, in the embodiment of FIG. 8 a non-volatile memory, namely a flash memory 830 and a system memory, namely a dynamic random access memory (DRAM) 835. As further seen, baseband processor 810 can further couple to a capture device 840 such as an image capture device that can record video and/or still images. In one or more embodiments, baseband processor 810 may include all or a portion of the clock logic 200 and/or the distributed polyphase filter 300 described above with reference to FIGS. 2-3.

To enable communications to be transmitted and received, various circuitry may be coupled between baseband processor 810 and an antenna 880. Specifically, a radio frequency (RF) transceiver 870 and a wireless local area network (WLAN) transceiver 875 may be present.

In general, RF transceiver 870 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 875, local wireless signals, such as according to a Bluetooth™ standard or an IEEE 802.11 standard such as IEEE 802.11a/b/g/n can also be realized. Although shown at this high level in the embodiment of FIG. 8, understand the scope of the present invention is not limited in this regard.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments. One example embodiment may be an apparatus including: a clock generator to generate differential clock signals; a distributed polyphase filter to obtain phase-corrected multi-phase clock signals based on the differential clock signals. The apparatus may also include transmit logic to generate at least one data signal based on the phase-corrected multi-phase clock signals. The apparatus may also include receiver logic to recover at least one data signal based on the phase-corrected multi-phase clock signals. The distributed polyphase filter may be to reduce phase distortion in the differential clock signals. The distributed polyphase filter may include at least four inverters. The at least four inverters may include a first inverter, where an input of the first inverter is coupled to a positive signal of a first pair of differential clock signals, and where an output of the first inverter is coupled to a positive signal of a second pair of differential clock signals. The at least four inverters may also include a second inverter, where an input of the second inverter is coupled to a negative signal of a first pair of differential clock signals, and where an output of the second inverter is coupled to a negative signal of a second pair of differential clock signals. The at least four inverters may also include a third inverter, where an input of the third inverter is coupled to a positive signal of a second pair of differential clock signals, and where an output of the third inverter is coupled to a negative signal of a first pair of differential clock signals. The at least four inverters may also include a fourth inverter, where an input of the fourth inverter is coupled to a negative signal of a second pair of differential clock signals, and where an output of the fourth inverter is coupled to a positive signal of a first pair of differential clock signals. The phase-corrected multi-phase clock signals may include a first pair of differential clock signals corresponding to a clock signal for an in-phase component. The phase-corrected multi-phase clock signals may include a second pair of differential clock corresponding to a clock signal for a quadrature component.

Another example embodiment may be a system including: a system on a chip comprising at least one core having at least one execution unit and transmit logic, the transmit logic including a clock generator to generate one or more clock signals, and a distributed polyphase filter to obtain multi-phase clock signals by phase-correcting the one or more clock signals. The system may also include a wireless device coupled to the system on the chip via an interconnect, where the interconnect is used to communicate at least one data signal between the wireless device and the transmit logic of the system on the chip. The system may also include a distribution network to distribute the multi-phase clock signals. The transmit logic may be to generate the at least one data signal based on the multi-phase clock signals. The distributed polyphase filter may include at least four inverters. The distributed polyphase filter may include at least two current mode logic (CML) differential buffers. The distributed polyphase filter may include at least two pseudo-differential differential buffers.

Yet another example embodiment may be a method including: generating a plurality of differential clock signals; correcting, using a distributed polyphase filter, the differential clock signals to obtain a plurality of phase-corrected multi-phase clock signals; and recovering a plurality of differential data signals using the plurality of phase-corrected multi-phase clock signals. The phase-corrected multi-phase clock signals may include four differential clock signals. The distributed polyphase filter may include at least four inverters. The distributed polyphase filter may include at least two current mode logic (CML) differential buffers. The distributed polyphase filter may include at least two pseudo-differential differential buffers.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments for the sake of illustration, those skilled in the art will appreciate numerous modifications and variations therefrom. It is intended that the appended claims cover all such modifications and variations as fall within the true spirit and scope of this present invention.

What is claimed is:

1. An apparatus comprising:
   a clock generator to generate at least four differential clock signals; and
   a distributed polyphase filter to obtain phase-corrected multi-phase clock signals based on the at least four differential clock signals, wherein the distributed polyphase filter comprises:
   at least four inverters; and
   for each differential clock signal of the at least four differential clock signals:
      an input to receive the differential clock signal;
      an output to provide a phase-corrected clock signal; and
      a direct coupling between the input and the output, wherein the direct coupling does not include any of the at least four inverters.

2. The apparatus of claim 1, further comprising transmit logic to generate at least one data signal based on the phase-corrected multi-phase clock signals.

3. The apparatus of claim 1, further comprising receiver logic to recover at least one data signal based on the phase-corrected multi-phase clock signals.

4. The apparatus of claim 1, wherein the distributed polyphase filter is to reduce phase distortion in the at least four differential clock signals.

5. The apparatus of claim 1, wherein the at least four inverters comprise a first inverter, wherein an input of the first inverter is coupled to a positive signal of a first pair of differential clock signals, and wherein an output of the first inverter is coupled to a positive signal of a second pair of differential clock signals.

6. The apparatus of claim 1, wherein the at least four inverters comprise a second inverter, wherein an input of the second inverter is coupled to a negative signal of a first pair of differential clock signals, and wherein an output of the second inverter is coupled to a negative signal of a second pair of differential clock signals.

7. The apparatus of claim 1, wherein the at least four inverters comprise a third inverter, wherein an input of the third inverter is coupled to a positive signal of a second pair of differential clock signals, and wherein an output of the third inverter is coupled to a negative signal of a first pair of differential clock signals.

8. The apparatus of claim 1, wherein the at least four inverters comprise a fourth inverter, wherein an input of the fourth inverter is coupled to a negative signal of a second pair of differential clock signals, and wherein an output of the fourth inverter is coupled to a positive signal of a first pair of differential clock signals.

9. The apparatus of claim 1, wherein the phase-corrected multi-phase clock signals comprise a first pair of differential clock signals corresponding to a clock signal for an in-phase component.

10. The apparatus of claim 9, wherein the phase-corrected multi-phase clock signals comprise a second pair of differential clock corresponding to a clock signal for a quadrature component.

11. A system comprising:
a system on a chip comprising at least one core having at least one execution unit and transmit logic, the transmit logic comprising:
a clock generator to generate four or more differential clock signals;
a distributed polyphase filter to obtain phase-corrected clock signals by phase-correcting the four or more differential clock signals, wherein the distributed polyphase filter comprises:
at least four inverters; and
for each differential clock signal of the four or more differential clock signals:
an input to receive the differential clock signal;
an output to provide a phase-corrected clock signal; and
a direct coupling between the input and the output, wherein the direct coupling does not include any of the at least four inverters; and
a wireless device coupled to the system on the chip via an interconnect, the interconnect used to communicate at least one data signal between the wireless device and the transmit logic of the system on the chip.

12. The system of claim 11, further comprising a distribution network to distribute the phase-corrected clock signals.

13. The system of claim 11, the transmit logic to generate the at least one data signal based on the phase-corrected clock signals.

14. The system of claim 11, wherein the at least four inverters comprise a first inverter, wherein an input of the first inverter is coupled to a positive signal of a first pair of differential clock signals, and wherein an output of the first inverter is coupled to a positive signal of a second pair of differential clock signals.

15. The system of claim 14, wherein the at least four inverters comprise a second inverter, wherein an input of the second inverter is coupled to a negative signal of a first pair of differential clock signals, and wherein an output of the second inverter is coupled to a negative signal of a second pair of differential clock signals.

16. The system of claim 15, wherein the at least four inverters comprise a third inverter, wherein an input of the third inverter is coupled to a positive signal of a second pair of differential clock signals, and wherein an output of the third inverter is coupled to a negative signal of a first pair of differential clock signals.

17. A method comprising:
generating at least four differential clock signals;
correcting, using a distributed polyphase filter, the at least four differential clock signals to obtain at least four phase-corrected multi-phase clock signals, wherein the distributed polyphase filter comprises:
at least four inverters; and
for each differential clock signal of the at least four differential clock signals:
an input to receive the differential clock signal;
an output to provide a phase-corrected clock signal; and
a direct coupling between the input and the output, wherein the direct coupling does not include any of the at least four inverters; and
recovering a plurality of differential data signals using the plurality of at least four phase-corrected multi-phase clock signals.

18. The method of claim 17, wherein the at least four phase-corrected multi-phase clock signals comprise two pairs of differential clock signals, wherein each pair of differential clock signals comprises a positive differential clock signal and a negative differential clock signal.

19. The method of claim 17, wherein the at least four inverters comprise a first inverter, wherein an input of the first inverter is coupled to a positive signal of a first pair of differential clock signals, and wherein an output of the first inverter is coupled to a positive signal of a second pair of differential clock signals.

20. The method of claim 17, wherein the at least four inverters comprise a second inverter, wherein an input of the second inverter is coupled to a negative signal of a first pair of differential clock signals, and wherein an output of the second inverter is coupled to a negative signal of a second pair of differential clock signals.

21. The method of claim 17, wherein the at least four inverters comprise a third inverter, wherein an input of the third inverter is coupled to a positive signal of a second pair of differential clock signals, and wherein an output of the third inverter is coupled to a negative signal of a first pair of differential clock signals.

22. The method of claim 17, wherein the at least four inverters comprise a fourth inverter, wherein an input of the fourth inverter is coupled to a negative signal of a second pair of differential clock signals, and wherein an output of the fourth inverter is coupled to a positive signal of a first pair of differential clock signals.

* * * * *